United States Patent
Choi et al.

(10) Patent No.: US 10,505,134 B2
(45) Date of Patent: Dec. 10, 2019

(54) ORGANIC ELECTROLUMINESCENCE DISPLAY DEVICE HAVING STACKED ORGANIC LIGHT EMITTING LAYERS AND METHOD FOR MANUFACTURING THE SAME

(71) Applicant: Samsung Display Co., Ltd., Yongin-si, Gyeonggi-do (KR)

(72) Inventors: Jehong Choi, Suwon-si (KR); Ji-hye Shim, Namyangju-si (KR); Pyungeun Jeon, Seoul (KR); Jihwan Yoon, Yongin-si (KR); Sangwoo Pyo, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/033,069

(22) Filed: Jul. 11, 2018

(65) Prior Publication Data

US 2019/0081119 A1    Mar. 14, 2019

(30) Foreign Application Priority Data

Sep. 14, 2017   (KR) .................. 10-2017-0118051

(51) Int. Cl.
*H01L 51/50*    (2006.01)
*H01L 27/32*    (2006.01)
(Continued)

(52) U.S. Cl.
CPC .......... *H01L 51/504* (2013.01); *H01L 27/323* (2013.01); *H01L 27/3211* (2013.01);
(Continued)

(58) Field of Classification Search
CPC ............. H01L 27/3246; H01L 27/3218; H01L 27/3258; H01L 27/323; H01L 51/504;
(Continued)

(56) References Cited

U.S. PATENT DOCUMENTS 9,048,456 B2   6/2015   Chang et al.
9,059,113 B2   6/2015   Kwon et al.
(Continued)

FOREIGN PATENT DOCUMENTS

KR   10-2013-0080643 A   7/2013
KR   10-2013-0093187 A   8/2013
(Continued)

*Primary Examiner* — Michael Jung
(74) *Attorney, Agent, or Firm* — Lewis Roca Rothgerber Christie LLP

(57) ABSTRACT

An organic electroluminescence display device includes: a substrate; a first electrode including a first sub-electrode, a second sub-electrode, and a third sub-electrode which are arranged on the substrate; an organic light emitting layer on the first electrode and including a first light emitting layer, a second light emitting layer, and a third light emitting layer; and a second electrode on the organic light emitting layer, and the first light emitting layer is on the first sub-electrode, the second light emitting layer is on the first sub-electrode, the second sub-electrode, and the third sub-electrode, and the third light emitting layer is on the third sub-electrode, and the first light emitting layer is on a lower portion of the second light emitting layer, and the third light emitting layer is on an upper portion of the second light emitting layer.

20 Claims, 12 Drawing Sheets

(51) Int. Cl.
  *H01L 51/56* (2006.01)
  *H01L 51/52* (2006.01)
(52) U.S. Cl.
  CPC ...... *H01L 27/3258* (2013.01); *H01L 51/5056* (2013.01); *H01L 51/5072* (2013.01); *H01L 51/5203* (2013.01); *H01L 51/5206* (2013.01); *H01L 51/5209* (2013.01); *H01L 51/5221* (2013.01); *H01L 51/5225* (2013.01); *H01L 51/56* (2013.01); *H01L 27/3216* (2013.01); *H01L 27/3218* (2013.01); *H01L 27/3246* (2013.01); *H01L 51/5265* (2013.01)
(58) Field of Classification Search
  CPC ............. H01L 51/5056; H01L 51/5068; H01L 51/5072; H01L 51/5084; H01L 51/5203; H01L 51/5206; H01L 51/5209; H01L 51/5221; H01L 51/5225
  See application file for complete search history.

(56) References Cited

U.S. PATENT DOCUMENTS

2007/0046185 A1\* 3/2007 Kim .................... H01L 27/3216
                                                        313/504
2012/0161172 A1 6/2012 Oyamada et al.
2013/0207085 A1 8/2013 Im et al.
2016/0233277 A1\* 8/2016 Chae .................. H01L 27/3218

FOREIGN PATENT DOCUMENTS

KR          10-1331232 B1    11/2013
KR     10-2016-0015481 A      2/2016
KR          10-1705823 B1     2/2017

\* cited by examiner

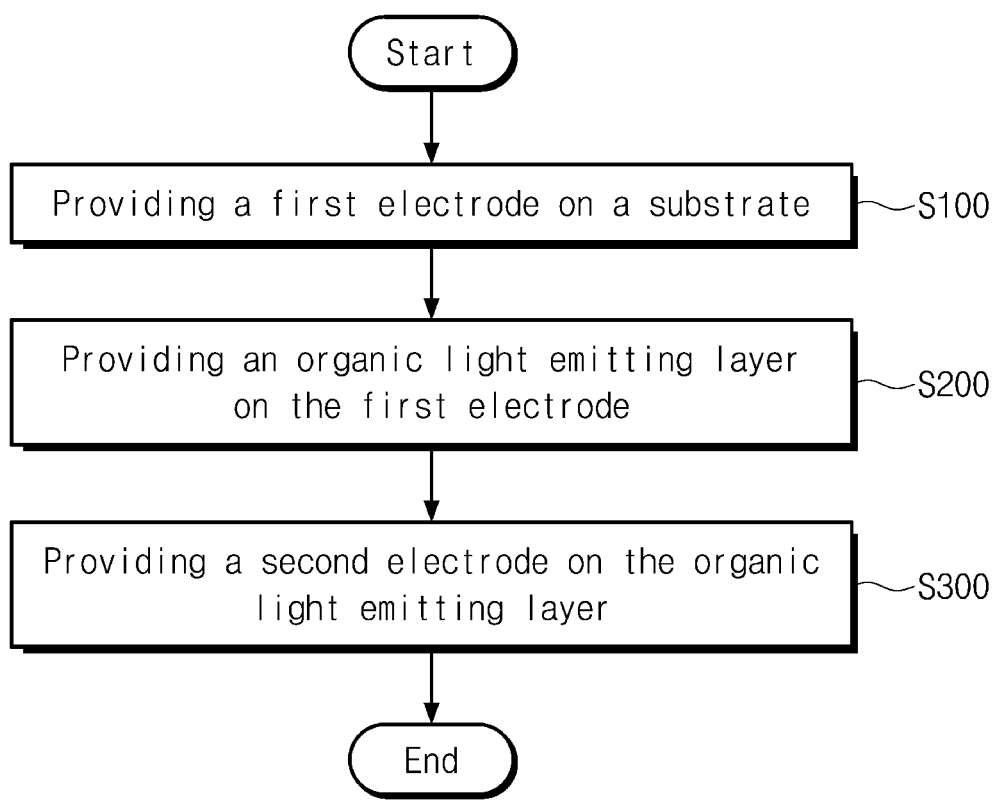

ORGANIC ELECTROLUMINESCENCE DISPLAY DEVICE HAVING STACKED ORGANIC LIGHT EMITTING LAYERS AND METHOD FOR MANUFACTURING THE SAME

CROSS-REFERENCE TO RELATED APPLICATION

This application claims priority to and the benefit of Korean Patent Application No. 10-2017-0118051, filed on Sep. 14, 2017 in the Korean Intellectual Property Office, the entire content of which is hereby incorporated by reference.

BACKGROUND

1. Field

Aspects of embodiments of the present disclosure relate to an organic electroluminescence display device and a method for manufacturing the same.

2. Description of the Related Art

As an image display device, an organic electroluminescence display device using an organic electroluminescence device has been actively developed. An organic electroluminescence display device is different from a liquid crystal display device, and the like, in that it is a so-called self-luminescence display device which realizes a display by recombining holes and electrons injected from a first electrode and a second electrode in a light emitting layer to emit a light emitting material which is an organic compound included in the light emitting layer.

As an organic electroluminescence device, for example, an organic device composed of a first electrode, a hole transport layer disposed on the first electrode, a light emitting layer disposed on the hole transport layer, an electron transport layer disposed on the light emitting layer, and a second electrode disposed on the electron transport layer is known. From the first electrode, a hole is injected, and the injected hole moves through the hole transport layer to be injected to the light emitting layer. From the second electrode, an electron is injected, and the injected electron moves through the electron transport layer to be injected to the light emitting layer. The hole and the electron both injected to the light emitting layer are recombined to generate an exciton in the light emitting layer. An organic electroluminescence device emits light using light generated when the exciton falls to a ground state again. However, an organic electroluminescence device is not limited to the configuration described above, and various modifications thereof are possible.

SUMMARY

According to an aspect of embodiments of the present disclosure, an organic electroluminescence display device includes a common light emitting layer, and a method for manufacturing the same is provided. According to an aspect of embodiments of the present disclosure, an organic electroluminescence display device having high-resolution and a method for manufacturing the same are provided.

According to another aspect of embodiments of the present disclosure, an organic electroluminescence display device having excellent process efficiency and reduced cost, and a method for manufacturing the same, are provided.

According to one or more embodiments of the present disclosure, an organic electroluminescence display device includes: a substrate; a first electrode including a first sub-electrode, a second sub-electrode, and a third sub-electrode which are arranged on the substrate and spaced apart from each other; an organic light emitting layer on the first electrode and including a first light emitting layer, a second light emitting layer, and a third light emitting layer; and a second electrode on the organic light emitting layer, wherein the first light emitting layer is on the first sub-electrode, the second light emitting layer is on the first sub-electrode, the second sub-electrode, and the third sub-electrode, the third light emitting layer is on the third sub-electrode. The first light emitting layer is on a lower portion of the second light emitting layer, and the third light emitting layer is on an upper portion of the second light emitting layer. The first light emitting layer is a red light emitting layer configured to emit red light, the second light emitting layer is a green light emitting layer configured to emit green light, and the third light emitting layer is a blue light emitting layer configured to emit blue light.

The organic electroluminescence display device according to an embodiment of the present disclosure may include a first pixel region configured to emit red light, a second pixel region configured to emit green light, and a third pixel region configured to emit blue light, wherein a shortest distance between the first pixel region and the second pixel region is shorter than a shortest distance between the first pixel region and the third pixel region on a plane.

In an embodiment, the second light emitting layer may be on the first pixel region, the second pixel region, and the third pixel region, the first light emitting layer may be on the first pixel region, and the third light emitting layer may be on the third pixel region.

The organic electroluminescence display device according to an embodiment of the present disclosure may further include a buffer layer on at least one of an upper portion or a lower portion of the second light emitting layer.

The organic electroluminescence display device according to an embodiment of the present disclosure may further include a first buffer layer on a lower portion of the second light emitting layer, and the first light emitting layer may be between the first buffer layer and the second light emitting layer.

The organic electroluminescence display device according to an embodiment of the present disclosure may further include a second buffer layer between the first light emitting layer and the first buffer layer.

In an embodiment, the first buffer layer may be on the first sub-electrode, the second sub-electrode, and the third sub-electrode.

The organic electroluminescence display device according to an embodiment of the present disclosure may further include a third buffer layer between the first light emitting layer and the second light emitting layer.

The organic electroluminescence display device according to an embodiment of the present disclosure may further include a p-dopant layer between the second light emitting layer and the third light emitting layer.

The organic electroluminescence display device according to an embodiment of the present disclosure may further include a fourth buffer layer between the p-dopant layer and the third light emitting layer.

In an embodiment, the second light emitting layer may be configured to emit light in a region overlapping the second sub-electrode.

In an embodiment, the second light emitting layer may not be configured to emit light in a region area overlapping the first sub-electrode and the third sub-electrode.

In an embodiment, the first electrode may further include a fourth sub-electrode, the organic light emitting layer may further include a fourth light emitting layer on the fourth sub-electrode, a part of the second light emitting layer may be on the fourth sub-electrode, and the fourth light emitting layer may be configured to emit near-infrared light.

In an embodiment, the fourth light emitting layer may be on an upper portion of the second light emitting layer.

In an embodiment, the fourth light emitting layer may be on a lower portion of the second light emitting layer.

The organic electroluminescence display device according to an embodiment of the present disclosure may further include: a first buffer layer on a lower portion of the second light emitting layer; a second buffer layer between the first light emitting layer and the first buffer layer; a fourth buffer layer between the second light emitting layer and the third light emitting layer; a p-dopant layer between the second light emitting layer and the fourth buffer layer; and a fifth buffer layer on the third light emitting layer.

According to one or more embodiments of the present disclosure, a method for manufacturing an organic electroluminescence display device includes: forming a first electrode having a first sub-electrode, a second sub-electrode, and a third sub-electrode on a substrate and being spaced apart from each other; forming an organic light emitting layer disposed on the first electrode and having a first light emitting layer, a second light emitting layer, and a third light emitting layer; and forming a second electrode on the organic light emitting layer, wherein the forming the organic light emitting layer includes forming the first light emitting layer on the first sub-electrode, forming the second light emitting layer on the first sub-electrode, the second sub-electrode, and the third sub-electrode, and forming the third light emitting layer on the third sub-electrode. The first light emitting layer is a red light emitting layer configured to emit red light, the second light emitting layer is a green light emitting layer configured to emit green light, and the third light emitting layer is a blue light emitting layer configured to emit blue light.

In an embodiment, the forming of the first light emitting layer and the forming of the third light emitting layer may be performed using a mask having an opening, respectively, and the forming of the second light emitting layer may be performed without a mask.

BRIEF DESCRIPTION OF THE DRAWINGS

The accompanying drawings are included to provide a further understanding of the present disclosure, and are incorporated in and constitute a part of this specification. The drawings illustrate some exemplary embodiments of the present disclosure and, together with the description, serve to explain principles of the present disclosure. In the drawings:

FIG. 11 is a schematic flowchart of a method for manufacturing an organic electroluminescence display device according to an embodiment of the present disclosure.

DETAILED DESCRIPTION

Figure 1:
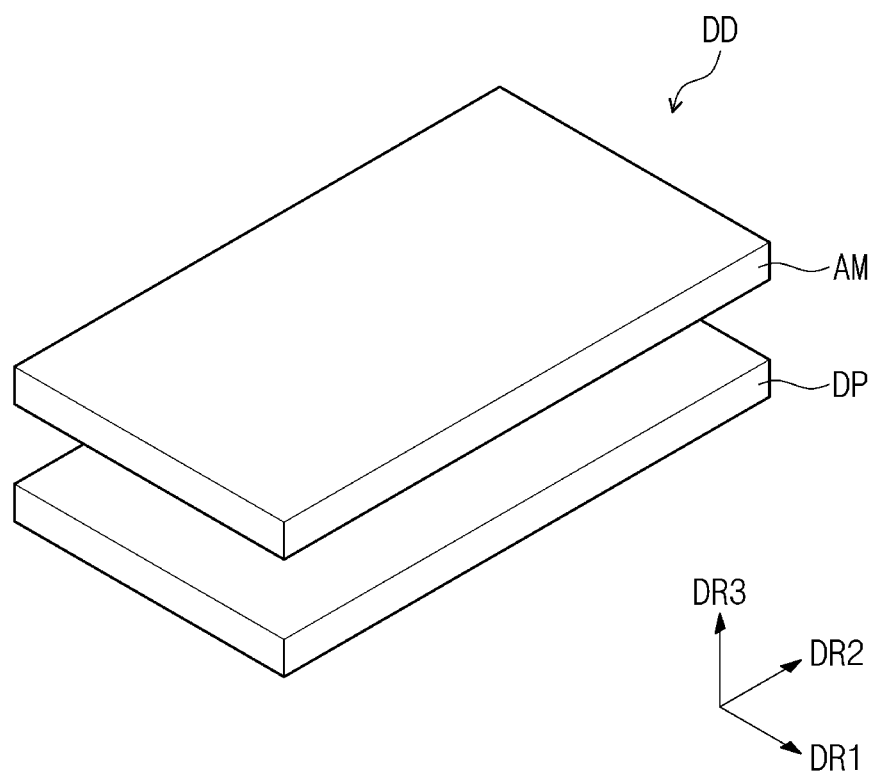
FIG. 1 is a perspective view of an organic electroluminescence display device according to an embodiment of the present disclosure.

Aspects, features, and advantages of the present disclosure described above may be understood easily by reference to some exemplary embodiments described herein and the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

In describing each drawing, similar reference numerals are used for similar elements. Also, in the accompanying drawings, the dimensions of structures may be exaggerated for clarity of the present disclosure. It is to be understood that, although the terms "first," "second," etc. may be used herein to describe various elements, these elements should not be limited by these terms. These terms are used to distinguish one element from another. For example, a "first" element could be termed a "second" element, and, similarly, a "second" element could be termed a "first" element, without departing from the scope of the present invention. The terms of a singular form may include plural forms unless the context clearly indicates otherwise.

In this application, the terms "comprise" or "have" are intended to designate features, numbers, steps, operations, elements, parts, or combinations thereof described in the specifications of the present disclosure but not to exclude the possibility of the presence or the addition of one or more other features, numbers, steps, operations, elements, parts, or combinations thereof. It is also to be understood that when a portion, such as a layer, a film, a region, or a plate is referred to as being "on" another portion, it can be directly on the other portion, or one or more intervening portions may also be present. Also, it is to be understood that when a portion, such as a layer, a film, a region, or a plate is referred to as being "under" another portion, it can be directly under, or one or more intervening portions may also be present.

Herein, an organic electroluminescence display device according to an embodiment of the present disclosure will be described with reference to the accompanying drawings.

FIG. 1 is a perspective view of an organic electroluminescence display device DD according to an embodiment of the present disclosure. Referring to FIG. 1, the organic electroluminescence display device DD according to an embodiment of the present disclosure includes an organic electroluminescence display panel DP, and an additional member AM on the organic electroluminescence display panel DP. The additional member AM which is common in the art may be employed without limitation. For example, the additional member AM may be any of an input sensing unit, an optical member, a window member, and the like.

An input sensing unit may recognize a direct touch of a user, an indirect touch of a user, a direct touch of an object, or an indirect touch of an object. An input sensing unit may recognize at least one of the position of a touch and the strength (pressure) of a touch externally applied. The input sensing unit according to an embodiment of the present disclosure may have any of various structures, or may be formed of any of various materials, but is not limited to any one embodiment. For example, the input sensing unit in the display device DD according to an embodiment may be a touch sensing unit configured to sense a touch.

An optical member may block external light provided to the organic electroluminescence display panel DP from the outside. An optical member may be a polarizing member blocking external light, or a color filter member having a color filter layer.

A window member may protect the organic electroluminescence display panel DP from an external force. An image emitted from the organic electroluminescence display panel DP may be finally transmitted through a window member to be recognized by a user.

In an embodiment, upper surfaces of the organic electroluminescence display panel DP and the additional member AM are parallel to a plane defined by a first direction axis DR1 and a second direction axis DR2. A thickness direction of the organic electroluminescence display panel DP is indicated by a third direction axis DR3. Upper sides (or upper portions) and lower sides (or lower portions) of each member are separated by the third direction axis DR3. However, the directions indicated by the first to third direction axes DR1 to DR3 are relative concepts and may be converted to other directions. Herein, first to third directions are directions respectively indicated by the first to third direction axes DR1 to DR3 and refer to the same reference numerals thereof.

In the present specification, "on a plane" may mean that an organic electroluminescence display device is viewed in the third direction DR3.

Figure 2:
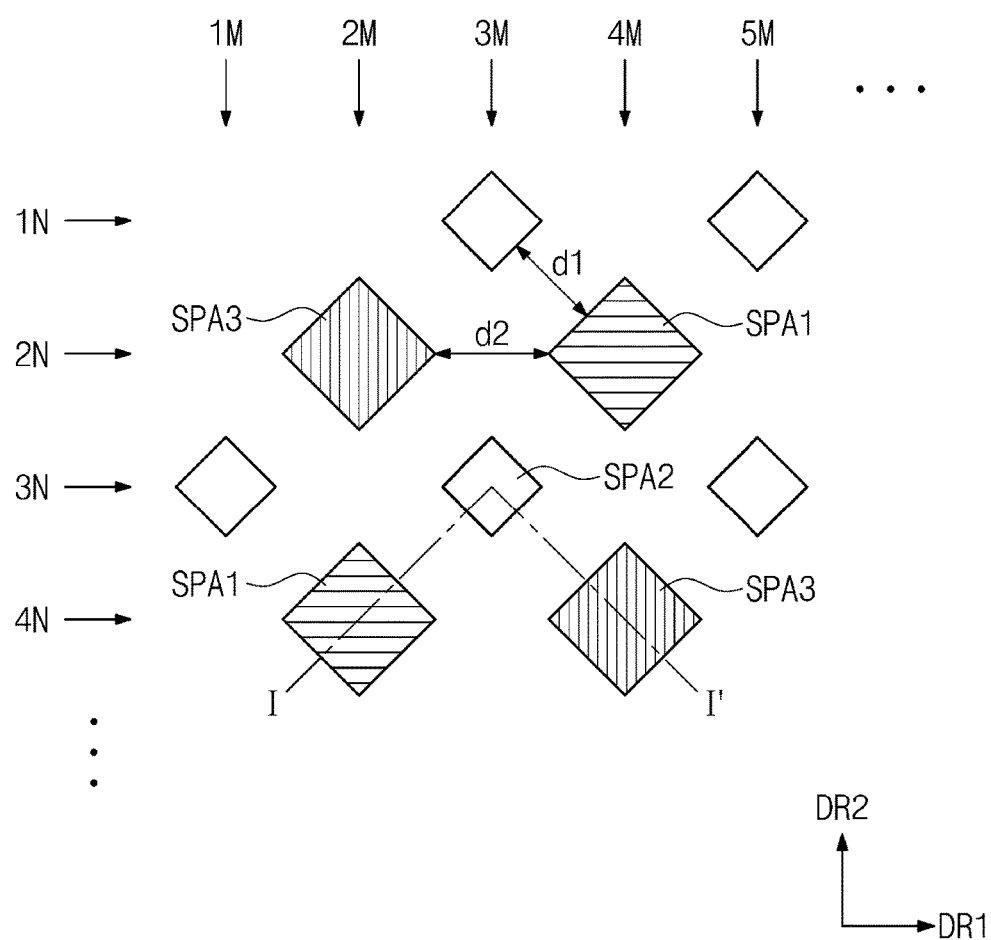
FIG. 2 is a schematic layout diagram of a plurality of pixels of an organic electroluminescence display device according to an embodiment of the present disclosure.

FIG. 2 is a schematic layout diagram of a plurality of pixels of an organic electroluminescence display device according to an embodiment of the present disclosure.

The organic electroluminescence display device according to an embodiment of the present disclosure may include a plurality of pixels, and the plurality of pixels may be arranged, for example, in a pentile type. For example, a rendering operation for expressing a color by sharing adjacent pixels may be applied. Each of the plurality of pixels has a corresponding pixel region. For example, referring to FIG. 2, a plurality of second pixel regions SPA2 corresponding to a second pixel are arranged at a an interval (e.g., a predetermined interval) in a first row 1N, a first pixel region SPA1 corresponding to a first pixel and a third pixel region SPA3 corresponding to a third pixel are alternately arranged in an adjacent second row 2N, a plurality of the second pixel regions SPA2 are arranged at an interval (e.g., a predetermined interval) in an adjacent third row 3N, and a first pixel region SPA1 and a third pixel region SPA3 are alternately arranged in an adjacent fourth row 4N. Such an arrangement of pixels may be repeated up to an N row, but embodiments of the present disclosure are not limited thereto. In an embodiment, the first pixel region SPA1 and the third pixel region SPA3 may respectively have a larger area than the second pixel region SPA2.

FIG. 2 is exemplarily illustrated, and the shapes of the first pixel region SPA1, the second pixel region SPA2, and the third pixel region SPA3 are not limited to those shown in FIG. 2.

The plurality of the second pixel regions SPA2 arranged in the first row 1N and the plurality of the first pixel regions SPA1 and the third pixel regions SPA3 arranged in the second row 2N may be arranged in a staggered manner. Accordingly, the plurality of the second pixel regions SPA2 are arranged at an interval (e.g., a predetermined interval) in a first column 1M, the third pixel region SPA3 and the first pixel region SPA1 are alternately arranged in an adjacent second column 2M, a plurality of the second pixel regions SPA2 are arranged at an interval (e.g., a predetermined interval) in an adjacent third column 3M, a first pixel region SPA1 and a third pixel region SPA3 are alternately arranged in an adjacent fourth column 4M, and a plurality of the second pixel regions SPA2 are arranged at an interval (e.g., a predetermined interval) in an adjacent fifth column 5M. Such an arrangement of pixels may be repeated up to an M column.

In an embodiment, the first pixel region SPA1 is a region in which the first pixel for emitting red light is disposed, the second pixel region SPA2 is a region in which the second pixel for emitting green light is disposed, and the third pixel region SPA3 is a region in which the third pixel for emitting blue light is disposed. That is, in an embodiment, the first pixel region SPA1 is a red pixel region, the second pixel region SPA2 is a green pixel region, and the third pixel region SPA3 is a blue pixel region.

On a plane, a shortest distance d1 between the first pixel region SPA1 and the second pixel region SPA2 is shorter than a shortest distance d2 between the first pixel region SPA1 and the third pixel region SPA3. In other words, in an embodiment, the first pixel region SPA1 which is a red pixel region is arranged more adjacent or nearer to the second pixel region SPA2 which is a green pixel region than to the third pixel region SPA3 which is a blue pixel region.

Figure 3:
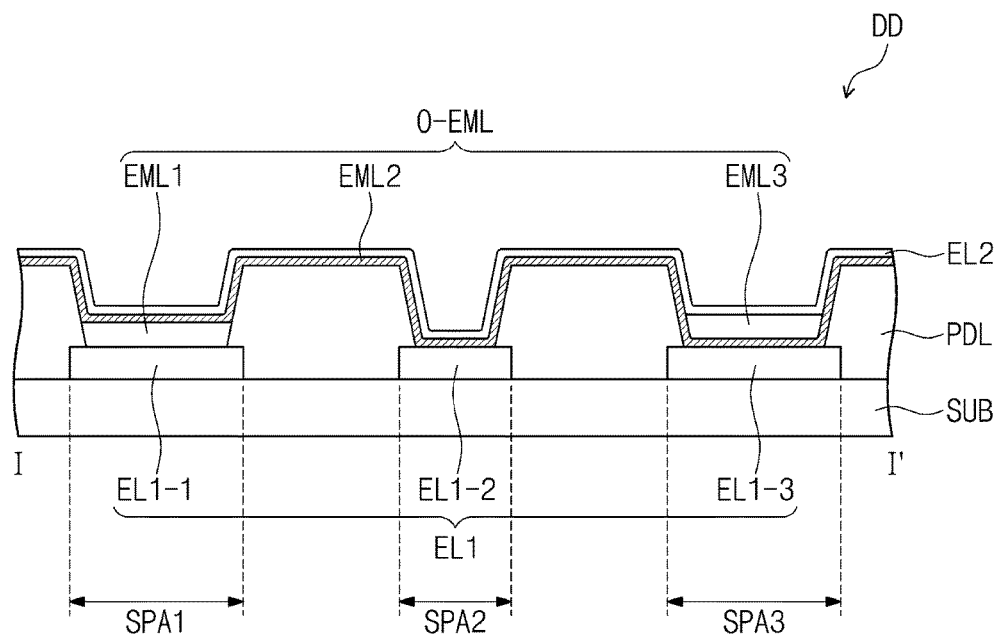
FIG. 3 is a cross-sectional view taken along the line I-I' of FIG. 2, according to an embodiment of the present disclosure.

FIG. 3 is a cross-sectional view taken along the line I-I' of FIG. 2, according to an embodiment of the present disclosure.

Referring to FIG. 3, the organic electroluminescence display device DD according to an embodiment of the present disclosure includes a substrate SUB, a first electrode EU disposed on the substrate SUB, an organic light emitting layer O-EML disposed on the first electrode EL1, and a second electrode EL2 disposed on the organic light emitting layer O-EML.

In an embodiment, the substrate SUB is not particularly limited to a material and may be a material that is commonly used, and may be formed, for example, of an insulating material, such as glass, plastic, or quartz. Examples of an organic polymer for forming the substrate SUB may include polyethylene terephthalate (PET), polyethylene naphthalate (PEN), polyimide, polyether sulfone, and the like. The substrate SUB may be selected in consideration of mechanical strength, thermal stability, transparency, surface smoothness, ease of handling, water resistance, and the like, thereof.

The first electrode EL1 may be, for example, a pixel electrode or a positive electrode. The first electrode EL1 may be a reflective electrode, but embodiments of the present disclosure are not limited thereto. For example, the first electrode EL1 may be a transmissive electrode or a transflective electrode. In an embodiment, when the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound, or a mixture thereof (for example, a mixture of Ag and Mg). In an embodiment, the first electrode EL1 may have a multilayer structure including a reflective film or a transflective film which are formed of the above-mentioned materials, and a transparent conductive film formed of indium tin oxide (ITO), indium zinc oxide (IZO), zinc oxide (ZnO), indium tin zinc oxide (ITZO), and the like.

The first electrode EL1 is disposed on the substrate SUB and includes a first sub-electrode EL1-1, a second sub-electrode EL1-2, and a third sub-electrode EL1-3. The first sub-electrode EL1-1, the second sub-electrode EL1-2, and the third sub-electrode EL1-3 may be provided in plurality.

The first sub-electrode EL1-1 is disposed in the first pixel region SPA1, the second sub-electrode is disposed in the second pixel region SPA2, and the third sub-electrode EL1-3 is disposed in the third pixel region SPA3.

A pixel defining layer PDL is disposed on a part of the first electrode EL1 and on the substrate SUB. The pixel defining layer PDL may be configured to partition the organic luminescence display device DD to correspond to each of the pixel regions SPA1, SPA2, and SPA3. The pixel defining layer PDL exposes a part of an upper surface of the first electrode EL1.

In an embodiment, the pixel defining layer PDL may be formed of a polymer resin. For example, the pixel defining layer PDL may be formed by including a polyacrylate-based resin, or a polyimide-based resin. In an embodiment, the pixel defining layer PDL may be formed by further including an inorganic material in addition to a polymer resin. In an embodiment, the pixel defining layer PDL may be formed by including a light absorbing material, or may be formed by including a black pigment or a black dye. The pixel defining layer PDL formed by including a black pigment or a black dye may implement a black pixel defining layer. When forming the pixel defining layer PDL, carbon black may be used as a black pigment or a black dye, but embodiments are not limited thereto.

In an embodiment, the pixel defining layer PDL may be formed of an inorganic material. For example, the pixel defining layer PDL may be formed by including any of SiNx, SiOx, SiOxNy, and the like.

The organic light emitting layer O-EML includes a first light emitting layer EML1, a second light emitting layer EML2, and a third light emitting layer EML3. The first light emitting layer EML1 is a red light emitting layer configured to emit red light when the organic electroluminescence display device DD is driven, the second light emitting layer EML2 is a green light emitting layer configured to emit green light when the organic electroluminescence display device DD is driven, and the third light emitting layer EML3 is a blue light emitting layer configured to emit blue light when the organic electroluminescence display device DD is driven.

The first light emitting layer EML1 is disposed in the first pixel region SPA1, and on the first sub-electrode EL1-1. The first light emitting layer EML1 does not overlap the second sub-electrode EL1-2 and the third sub-electrode EL1-3 on a plane. The first light emitting layer EML1 may include a common red light emitting material known in the art. For example, the first light emitting layer EML1 may include PBD:Eu(DBM)3(Phen)(tris(dibenzoylmethanato) phenanthoroline europium), or a fluorescent material including perylene. A dopant which may be included in the first light emitting layer EML1 may be selected, for example, from metal complexes such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum, or from organometallic complexes.

The second light emitting layer EML2 is commonly disposed in the first pixel region SPA1, the second pixel region SPA2, and the third pixel region SPA3, and on the first sub-electrode EL1-1, the second sub-electrode EL1-2, and the third sub-electrode EL1-3. The second light emitting layer EML2 is also disposed on the pixel defining layer PDL. The second light emitting layer EML2 may include a green light emitting material known in the art. For example, the second light emitting layer EML2 may include a fluorescent material including $Alq_3$(tris(8-hydroxyquinolino) aluminum). A dopant which may be included in the second light emitting layer EML2 may be selected, for example, from metal complexes such as Ir(ppy)3(fac-tris(2-phenylpyridine)iridium), or from organometallic complexes.

The third light emitting layer EML3 is disposed in the third pixel region SPA3, and on the third sub-electrode EL1-3. The third light emitting layer EML3 does not overlap the first sub-electrode EL1-1 and the second sub-electrode EL1-2 on a plane. The third light emitting layer EML3 may include a common blue light material known in the art. For example, the third light emitting layer EML3 may include a fluorescent material including any one selected from the group consisting of spiro-DPVBi, spiro-6P, distyryl-benzene (DSB), distyryl-arylene (DSA), a polyfluorene(PFO)-based polymer, and a poly(p-phenylene vinylene (PPV)-based polymer. A dopant which may be included in the third light emitting layer EML3 may be selected, for example, from metal complexes such as $(4,6-F2ppy)_2Irpic$, or from organometallic complexes.

The second light emitting layer EML2 which is a green light emitting layer is a common green light emitting layer commonly disposed in all of the plurality of pixel regions SPA1, SPA2, and SPA3. The first light emitting layer EML1 which is a red light emitting layer and the third light emitting layer EML3 which is a blue light emitting layer are patterned light emitting layers disposed only in a corresponding pixel region, respectively.

As the first light emitting layer EML1 which is a red light emitting layer and the third light emitting layer EML3 which is a blue light emitting layer are disposed as patterned light emitting layers, and the second light emitting layer EML2 which is a green light emitting layer is disposed as a common light emitting layer, it is possible to reduce the area of the pixel defining layer PDL, which is necessary for preventing or substantially preventing color mixture, and the like. This is because a red light emitting layer and a blue light emitting layer are disposed farther apart than a red light emitting layer and a green light emitting layer. When a blue light emitting layer is disposed as a common light emitting layer, patterned light emitting layers become a red light emitting layer and a green light emitting layer, and a red light emitting layer and a green light emitting layer are disposed relatively close to each other, such that the degradation of characteristics due to color mixture and the like may become a problem. To prevent or substantially prevent this, the pixel defining layer PDL should occupy an area of a certain level and above, and as a result, it is disadvantageous in realizing high resolution.

As such, the organic electroluminescence display device DD according to an embodiment of the present disclosure is advantageous in high resolution by disposing a green light emitting layer as a common light emitting layer. Furthermore, by disposing a green light emitting layer as a common light emitting layer, a separate mask, chamber, and the like for forming the second light emitting layer EML2 which is a green light emitting layer are not necessary, such that the organic electroluminescence display device DD according to an embodiment of the present disclosure is also advantageous in process efficiency and in terms of cost.

In an embodiment, the first light emitting layer EML1 is disposed on a lower portion of the second light emitting layer EML2, and the third light emitting layer EML3 is disposed on an upper portion of the second light emitting layer EML2. That is, the first light emitting layer EML1 is disposed on a lower portion of the second light emitting layer EML2 in the first pixel region SPA1, and the third light emitting layer EML3 is disposed on an upper portion of the second light emitting layer EML2 in the third pixel region SPA3.

When the first light emitting layer EML1 which is a red light emitting layer is disposed on an upper portion of the second light emitting layer EML2 which is a green light emitting layer, there is a limitation that efficiency is reduced when compared with the case in which the first light emitting layer EML1 is disposed on a lower portion of the second light emitting layer EML2.

When the third light emitting layer EML3 which is a blue light emitting layer is disposed on a lower portion of the second light emitting layer EML2 which is a green light emitting layer, an electron is blocked by the second light emitting layer EML2, such that the electron is not sufficiently injected to the third light emitting layer EML3, and color mixture with green color emitted from the second light emitting layer EML2 may occur. There is also a limitation that it is not easy to adjust the resonance distance of a blue light emitting layer due to the thickness of the blue light emitting layer.

Therefore, the organic electroluminescence display device DD according to an embodiment of the present disclosure disposes the first light emitting layer EML1 on a lower portion of a common green light emitting layer, and disposes the third light emitting layer EML3 on an upper portion of the common green light emitting layer, such that it is advantageous in high efficiency, long life, and low driving voltage.

In the organic electroluminescence display device DD according to an embodiment of the present disclosure, the second light emitting layer EML2 emits light only in a region disposed in the second pixel region SPA2 which is a green light emitting region. That is, the second light emitting layer EML2 emits light in a region overlapping the second sub-electrode EL1-2, and does not emit light in a region overlapping the first sub-electrode EL1-1 and the third sub-electrode EL1-3.

The second electrode EL2 is disposed on the organic light emitting layer O-EML. The second electrode EL2, like the second light emitting layer EML2, may be commonly disposed on the first pixel region SPA1, the second pixel region SPA2, and the third pixel region SPA3.

The second electrode EL2 may be a common electrode or a cathode. The second electrode EL2 may be formed of a metal alloy or a conductive compound. The second electrode EL2 may be a transmissive electrode, a transflective electrode, or a reflective electrode. In an embodiment, when the second electrode EL2 is a transmissive electrode, the second electrode EL2 may be formed of a transparent metal oxide, for example, any of indium tin oxide (ITO), indium zinc oxide (IZO), zinc oxide (ZnO), indium tin zinc oxide (ITZO), and the like.

In an embodiment, when the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound, or a mixture thereof (for example, a mixture of Ag and Mg). In an embodiment, the second electrode EL2 may have a multilayer structure including a reflective film or a transflective film which are formed of any of the above-mentioned materials, and a transparent conductive film formed of indium tin oxide (ITO), indium zinc oxide (IZO), zinc oxide (ZnO), indium tin zinc oxide (ITZO), and the like.

In an embodiment, although not shown, the second electrode EL2 may be connected to an auxiliary electrode. When the second electrode EL2 is connected to the auxiliary electrode, the resistance of the second electrode EL2 may be reduced.

Figure 4:
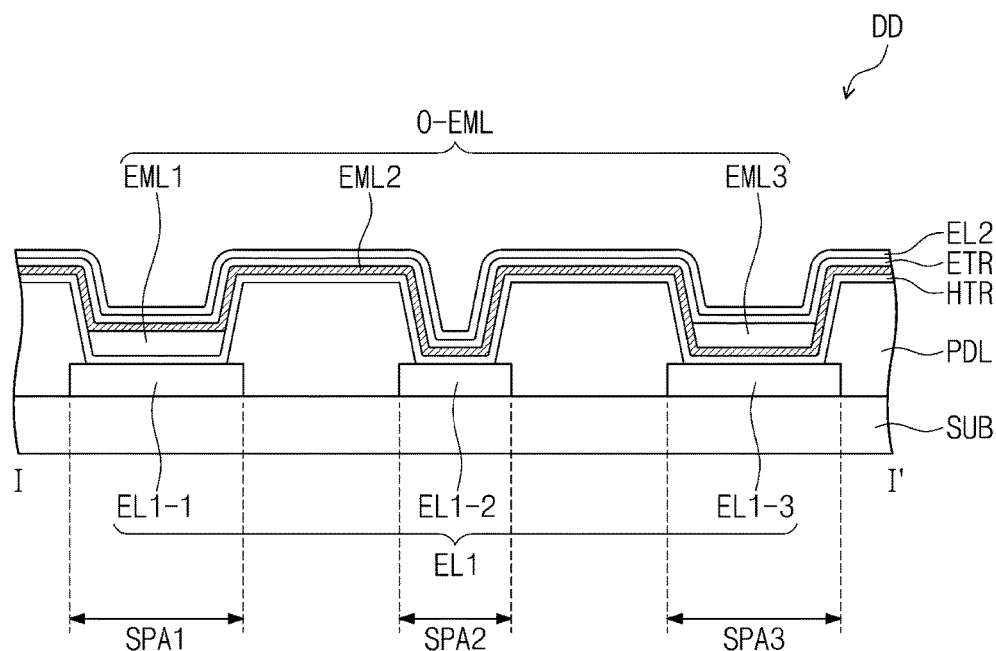
FIG. 4 is a cross-sectional view taken along the line I-I' of FIG. 2, according to an embodiment of the present disclosure.

FIG. 4 is a cross-sectional view taken along the line I-I' of FIG. 2, according to an embodiment of the present disclosure.

Referring to FIG. 4, the organic electroluminescence display device DD according to an embodiment of the present disclosure may further include a hole transport region HTR disposed between the first electrode EL1 and the organic light emitting layer O-EML. Also, the organic electroluminescence display device DD according to an embodiment of the present disclosure may further include an electron transport region ETR disposed between the organic light emitting layer O-EML and the second electrode EL2.

The hole transport region HTR and the electron transport region ETR which are common in the art may be employed without limitation. The hole transport region HTR and the electron transport region ETR may be commonly disposed on the first pixel region SPA1, the second pixel region SPA2, and the third pixel region SPA3, respectively.

The hole transport region HTR may have a single layer structure having a single layer formed of a single material, a single layer structure having a single layer formed of a plurality of different materials, or a multilayer structure having a plurality of layers formed of a plurality of different materials. For example, the hole transport region HTR may have a single layer structure having a single layer formed of a plurality of different materials, or may have a structure of a hole injection layer/a hole transport layer, a hole injection layer/a hole transport layer/a buffer layer, a hole injection layer/a buffer layer, a hole transport layer/a buffer layer, or a hole injection layer/a hole transport layer/an electron blocking layer, sequentially laminated from the first electrode EL1, but is not limited thereto.

The electron transport region ETR may have a single layer structure having a single layer formed of a single material, a single layer structure having a single layer formed of a plurality of different materials, or a multilayer structure having a plurality of layers formed of a plurality of different materials.

For example, the electron transport region ETR may have a single layer structure having a single layer of an electron injection layer or an electron transport layer, or a single layer structure having a single layer formed of an electron injection material and an electron transport material. Also, the electron transport region ETR may have a single layer structure having a single layer formed of a plurality of different materials, or may have a structure of an electron transport layer/an electron injection layer, or a hole blocking layer/an electron transport layer/an electron injection layer, sequentially laminated from the organic light emitting layer O-EML, but is not limited thereto.

Figure 5:
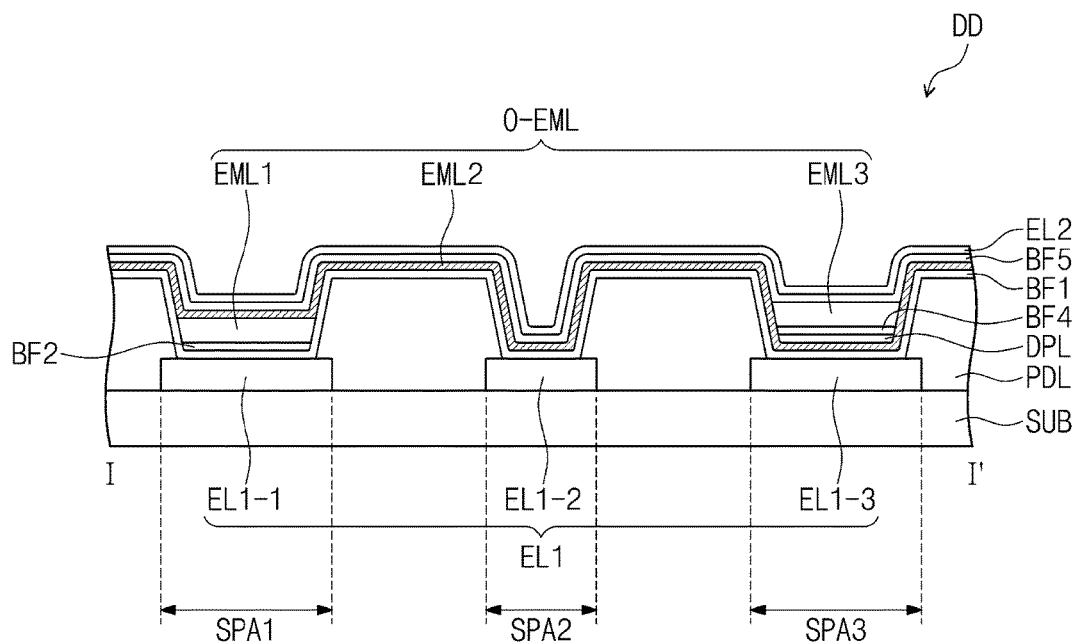
FIG. 5 is a cross-sectional view taken along the line I-I' of FIG. 2, according to an embodiment of the present disclosure.

FIG. 5 is a cross-sectional view taken along the line I-I' of FIG. 2, according to an embodiment of the present disclosure.

Referring to FIG. 5, the organic electroluminescence display device DD according to an embodiment of the present disclosure may further include one or more buffer layers. The buffer layer may be disposed on at least one of an upper portion or a lower portion of the second light emitting layer EML2. For example, the organic electroluminescence display device DD according to an embodiment of the present disclosure may further include a first buffer layer BF1 disposed on a lower portion of the second light emitting layer EML2. At least a part of the first buffer layer BF1 may be in contact with the second light emitting layer EML2.

Between the first buffer layer BF1 and the second light emitting layer EML2, the first light emitting layer EML1 may be disposed, but is not limited thereto. In an embodiment, the first buffer layer BF1 may be a common layer commonly disposed in the first pixel region SPA1, the second pixel region SPA2, and the third pixel region SPA3. In an embodiment, the first buffer layer BF1 may be disposed on the first sub-electrode EL1-1, the second sub-electrode EL1-2, the third sub-electrode EL1-3, and the pixel defining layer PDL.

The first buffer layer BF1 may be a layer which assists hole transport and/or hole injection. For example, at least a part of the first buffer layer BF1 may serve as a light emission auxiliary layer of the second light emitting layer EML2. The first buffer layer BF1 may include a common material known in the art, and may include, for example, a hole transport material and/or a hole injection material. The first buffer layer BF1 may be a layer including an organic material and/or an inorganic material.

The first buffer layer BF1 may be a layer serving as a resonance auxiliary layer for adjusting the resonance distance of the second light emitting layer EML2.

The organic electroluminescence display device DD according to an embodiment of the present disclosure may further include a second buffer layer BF2 disposed between the first light emitting layer EML1 and the first buffer layer BF1, but is not limited thereto. In an embodiment, the second buffer layer BF2 may be disposed only in the first pixel region SPA1. In an embodiment, the second buffer layer BF2, like the first electrode EML1, may be disposed only on the sub-electrode EL1-1.

The second buffer layer BF2 may be a layer which assists hole transport and/or hole injection to the first light emitting layer EML1. For example, the second buffer layer BF2 may serve as a light emission auxiliary layer of the first light emitting layer EML1. The second buffer layer BF2 and the first light emitting layer EML1 may be in contact with each other. The second buffer layer BF2 may include a common material known in the art, and may include, for example, a hole transport material and/or a hole injection material, but is not limited thereto. The second buffer layer BF2 may be a layer including an organic material and/or an inorganic material.

The second buffer layer BF2 may be a layer serving as a resonance auxiliary layer for adjusting the resonance distance of the first light emitting layer EML1.

A p-dopant layer DPL may be further disposed on a lower part of the third light emitting layer EML3. The p-dopant layer DPL may be disposed between the second light emitting layer EML2 and the third light emitting layer EML3. In an embodiment, the p-dopant layer DPL may be a layer disposed only in the third pixel region SPA3. The p-dopant layer DPL may serve to assist hole injection to the third light emitting layer EML3 which is disposed relatively far from the first electrode EL1. The p-dopant may employ a common hole injection material and/or a hole transport material, and a p-dopant known in the art without limitation. When the p-dopant layer DPL is further included, it is advantageous in low driving voltage when compared with a case in which the p-dopant DPL is not included.

In an embodiment, between the p-dopant layer DPL and the third light emitting layer EML3, a fourth buffer layer BF4 may be further disposed. In an embodiment, the fourth buffer layer BF4 may be a layer disposed only in the third pixel region SPA3. The fourth buffer layer BF4 may serve as an electron blocking layer between the second light emitting layer EML2 and the third light emitting layer EML3, thereby preventing or substantially preventing the second light emitting EML2 disposed in the third pixel region SPA3 from emitting light to prevent or substantially prevent color mixture. The fourth buffer layer BF4 may serve as a resonance auxiliary layer for adjusting the resonance distance of the third light emitting layer EML3. The fourth buffer layer BF4 may employ a common material known in the art without limitation. For example, the fourth buffer layer BF4 may be a layer including a hole transport material and/or a hole injection material. For example, the fourth buffer layer BF4 may be a layer including an organic material and/or an inorganic material.

In an embodiment, on the third light emitting layer EML3, a fifth buffer layer BF5 may be further disposed. The third light emitting layer EML3 is disposed on a lower portion of the second electrode EL2, and may be disposed on a lower portion of the electron transport region (ETR in FIG. 4) when the electron transport region is included. Although not limited thereto, the fifth buffer layer BF5 may be a layer commonly disposed in the first pixel region SPA1, the second pixel region SPA2, and the third pixel region SPA3. The fifth buffer layer BF5 may be a layer which assists electron injection and/or electron transport. The fifth buffer layer BF5 may be an electron stopping layer. The fifth buffer layer BF5 may employ a common material known in the art without limitation. The fifth buffer layer BF5 may be a layer including an organic material and/or an inorganic material. The fifth buffer layer BF5 may be a layer including an electron transport material and/or an electron injection material.

A pixel arranged in each pixel region may emit light by using the fine resonance effect. In an embodiment of the present disclosure, red light is emitted by a primary resonance in the first pixel region SPA1, green light is emitted by a primary resonance in the second pixel region SPA2, blue light is emitted by a secondary resonance in the third pixel region SPA3, but embodiments are not limited thereto. For example, red light may be emitted by a secondary resonance in the first pixel region SPA1, green light may be emitted by a secondary resonance in the second pixel region SPA2, and blue light may be emitted by a third-order resonance in the third pixel region SPA3. In a typical structure in which a blue common light emitting layer is disposed, blue light is emitted by a third-order resonance to improve efficiency, and in such a case, the organic electroluminescence display device DD according to an embodiment of the present disclosure has an effect of reducing material cost.

Figure 6:
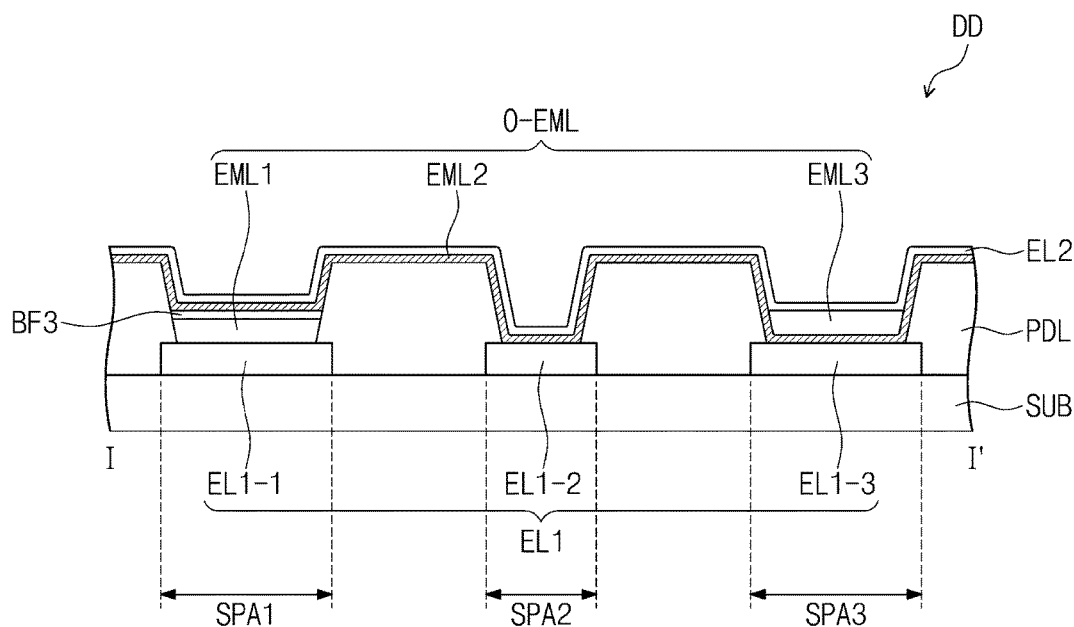
FIG. 6 is a cross-sectional view taken along the line I-I' of FIG. 2, according to an embodiment of the present disclosure.

FIG. 6 is a cross-sectional view taken along the line I-I' of FIG. 2, according to an embodiment of the present disclosure.

Referring to FIG. 6, between the first light emitting layer EML1 and the second light emitting layer EML2, a third buffer layer BF3 may be further disposed. The third buffer layer BF3 may be a layer for preventing or substantially preventing color mixture in the first light emitting layer EML1 and the second light emitting layer EML2. The third buffer layer BF3 may serve as a hole blocking layer between the first light emitting layer EML1 and the second light emitting layer EML2, and thereby preventing or substantially preventing the second light emitting layer EML2 disposed in the first pixel region SPA1 from emitting light to prevent or substantially prevent color mixture.

Figure 7:
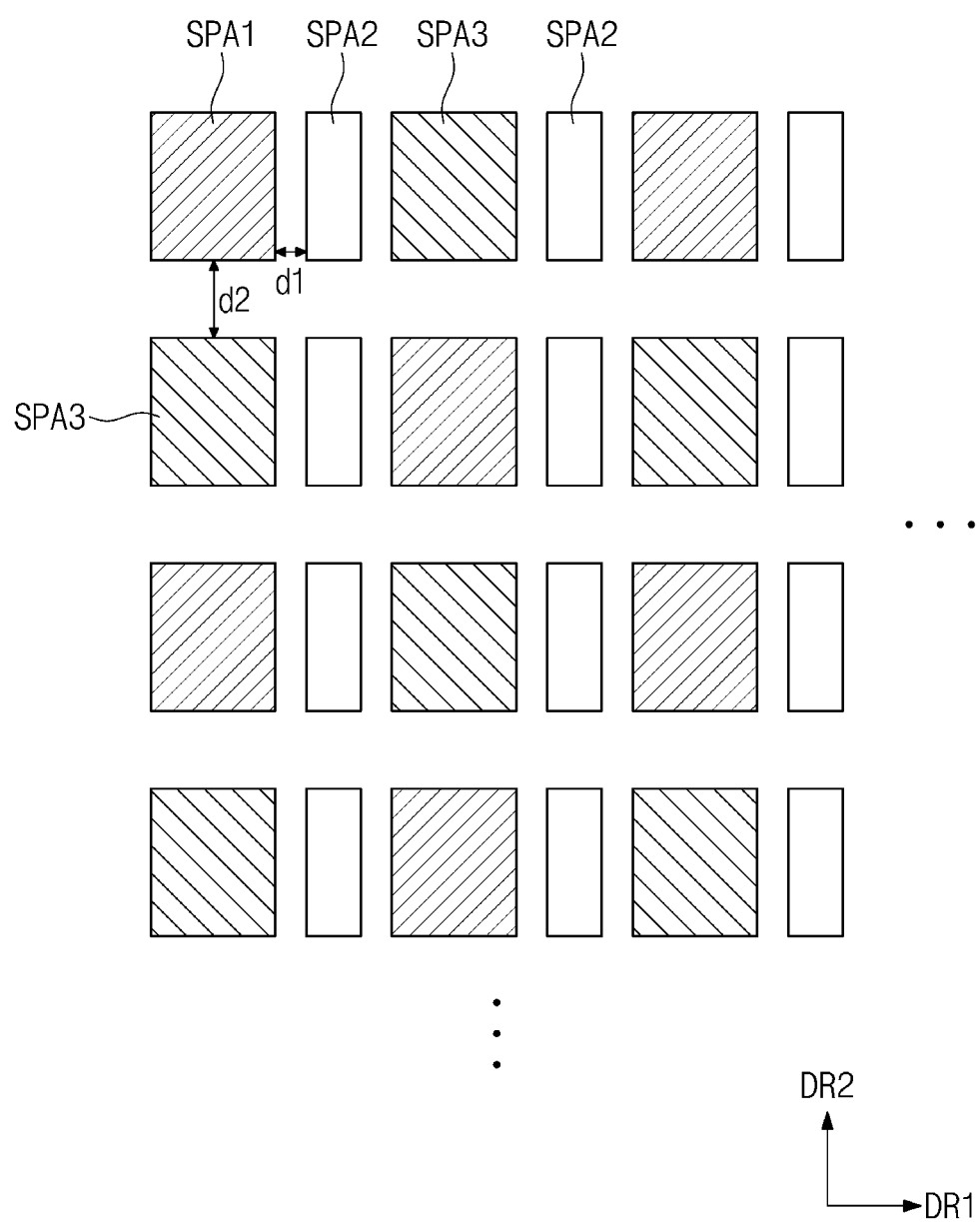
FIG. 7 is a schematic layout diagram of a plurality of pixels of an organic electroluminescence display device according to an embodiment of the present disclosure.

FIG. 7 is a schematic layout diagram of a plurality of pixels of an organic electroluminescence display device according to an embodiment of the present disclosure.

The pixel arrangement of the present disclosure is not limited to the structure of FIG. 2 described above. Referring to FIG. 7, the organic electroluminescence display device DD according to an embodiment of the present disclosure may have a structure in which an arrangement having an order of the first pixel region SPA1/the second pixel region SPA2/the third pixel region SPA3/the second pixel region SPA2 is repeated in a row direction (for example, DR1), and, in a column direction (for example, DR2), the first pixel region SPA1/the third pixel region SPA3 are alternately arranged in an odd column, and the second pixel region SPA2 is repeatedly arranged in an even column. In an embodiment, the shortest distance d1 between the first pixel region SPA1 and the second pixel region SPA2 is shorter than the shortest distance d2 between the first pixel region SPA1 and the third pixel region SPA3. In an embodiment, the first pixel region SPA1 and the third pixel region SPA3 respectively have a larger area than the second pixel region SPA2.

Figure 8:
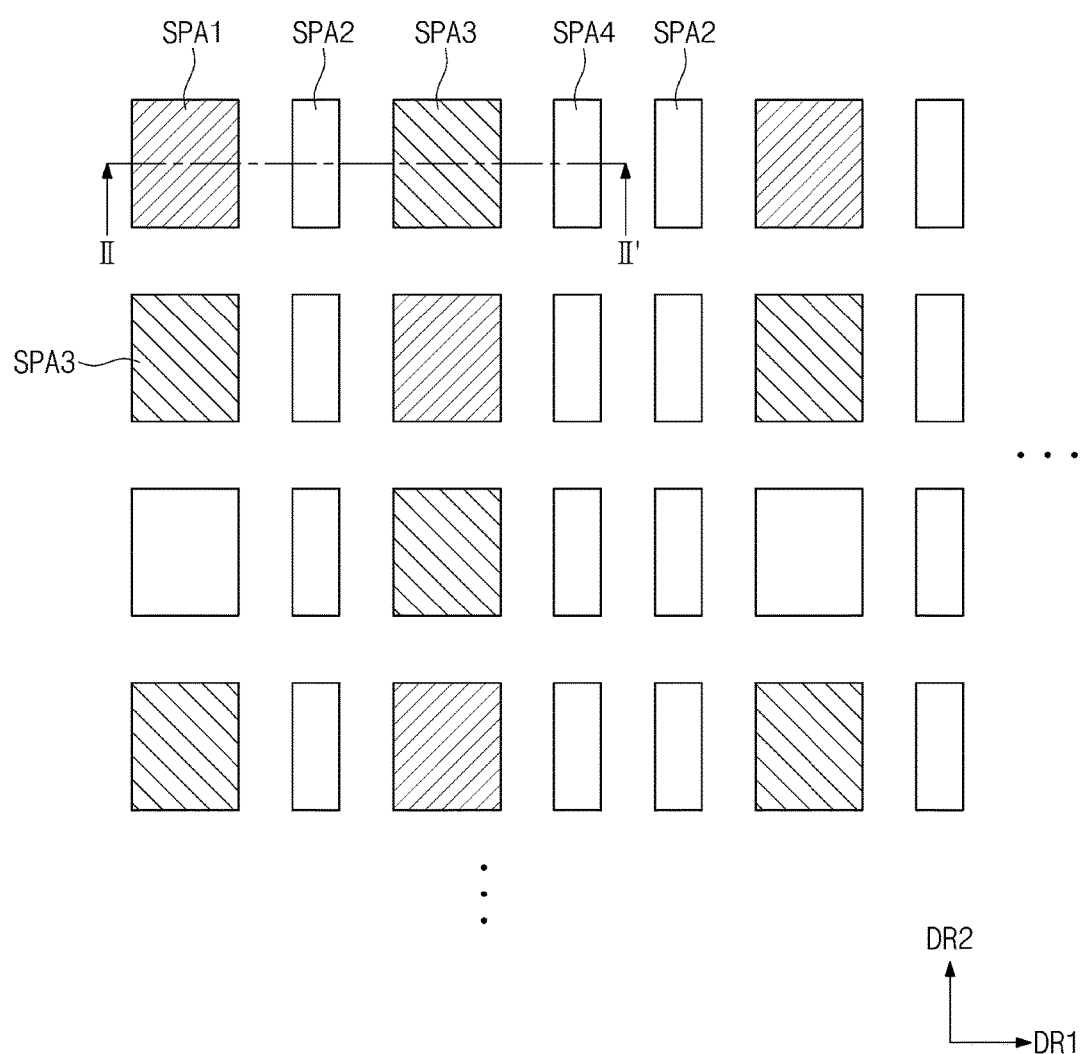
FIG. 8 is a schematic layout diagram of a plurality of pixels of an organic electroluminescence display device according to an embodiment of the present disclosure.
Figure 9:
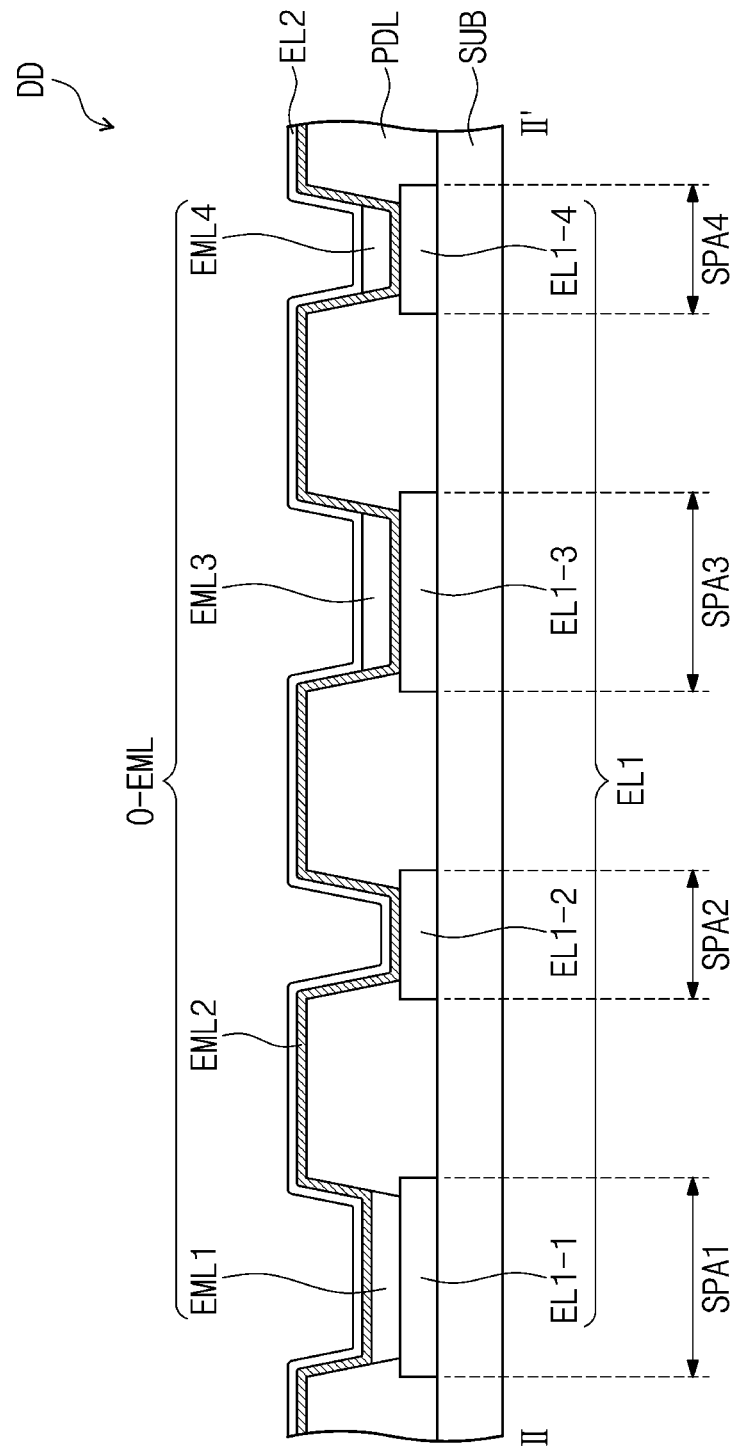
FIG. 9 is a cross-sectional view taken along the line II-II' of FIG. 8, according to an embodiment of the present disclosure.

FIG. 8 is a schematic layout diagram of a plurality of pixels of an organic electroluminescence display device according to an embodiment of the present disclosure. FIG. 9 is a cross-sectional view taken along the line II-II' of FIG. 8, according to an embodiment of the present disclosure.

Referring to FIGS. 8 and 9, a plurality of pixel regions may further include a fourth pixel region SPA4. The fourth pixel region SPA4 may be a near-infrared pixel region configured to emit near-infrared light. An arrangement, area, shape, and the like of the fourth pixel region SPA4 are exemplarily illustrated, but are not limited to that shown in FIG. 8. For example, in an embodiment, an area of the fourth pixel region SPA4 may be larger than an area of the second pixel region SPA2. Pixels arranged in the fourth pixel region SPA 4 which is a near-infrared pixel region may be utilized as pixels for implementing a sensing function using near-infrared light. As a result, a configuration having a sensing function, such as fingerprint recognition and iris recognition, may be disposed in a display region, such that the area of a non-display region may be reduced.

The first electrode EL1 may further include a fourth sub-electrode EL1-4. The fourth sub-electrode EL1-4 is disposed in the fourth pixel region SPA4. The fourth sub-electrode EL1-4 may be provided in plurality. In an embodiment, the fourth sub-electrode EL1-4 is disposed on the substrate SUB while being spaced apart from the first sub-electrode EL1-1, the second sub-electrode EL1-2, and the third sub-electrode EL1-3. In such a case, the second light emitting layer EML2 is also disposed on the fourth sub-electrode EL1-4. In other words, a part of the second light emitting layer EML2 is disposed on the fourth sub-electrode EL1-4.

The organic light emitting layer O-EML may further include a fourth light emitting layer EML4 disposed on the fourth sub-electrode EL1-4. The fourth light emitting layer EML4 is disposed in the fourth pixel region SPA4. When the organic electroluminescence display device DD according to an embodiment of the present disclosure is driven, the fourth light emitting layer EML4 may be a near-infrared light emitting layer configured to emit near-infrared light. Although not limited thereto, the fourth light emitting layer EML4 may be a near-infrared light emitting layer configured to emit near-infrared light having a wavelength range of 750 nm to 1000 nm. The organic electroluminescence display device DD according to an embodiment of the present disclosure does not require a separate mask, chamber, and the like for forming the second light emitting layer EML2, such that it is relatively easy to add a separate mask, chamber, and the like for forming the fourth light emitting layer EML4 from the point of view of process efficiency and in terms of cost.

In an embodiment, the fourth light emitting layer EML4 may be disposed on an upper portion of the second light emitting layer EML2, but is not limited thereto.

Figure 10:
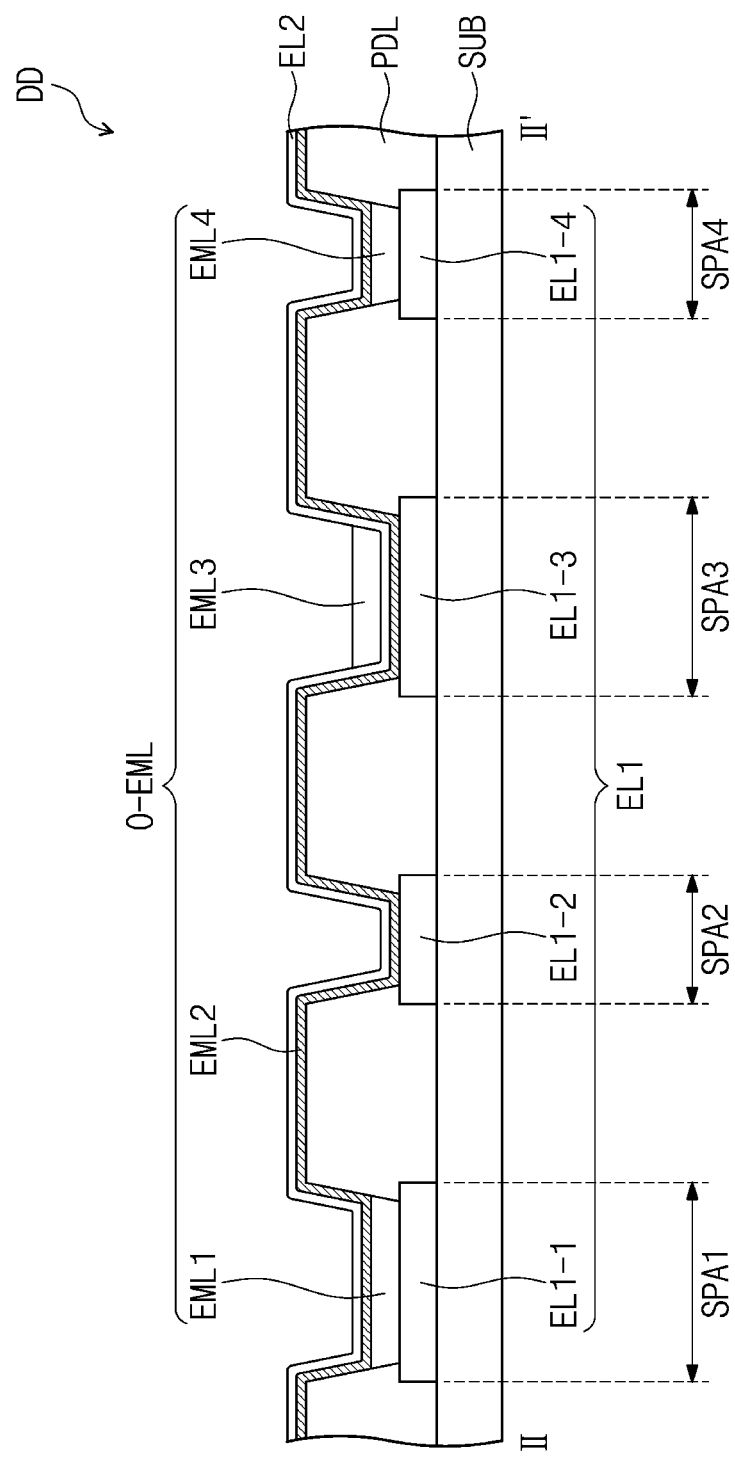
FIG. 10 is a cross-sectional view taken along the line II-II' of FIG. 8, according to an embodiment of the present disclosure.

FIG. 10 is a cross-sectional view taken along the line II-II' of FIG. 8, according to an embodiment of the present disclosure.

Referring to FIG. 10, the fourth light emitting layer EML4 may be disposed on a lower portion of the second light emitting layer EML2. In an embodiment, although not illustrated, between the second light emitting layer EML2 and the fourth light emitting layer EML4, an additional buffer layer may be disposed.

The organic electroluminescence display device DD according to an embodiment of the present disclosure may further include an additional element if necessary or desirable. For example, the organic electroluminescence display device DD according to an embodiment of the present disclosure may further include an encapsulation layer (not shown) disposed on the second electrode EL2. The encapsulation layer may have a single layer or a plurality of layers laminated thereon. The encapsulation layer may include at least one of an organic layer and an inorganic layer. In an embodiment, the encapsulation layer may be formed by including at least one organic layer and at least one inorganic layer.

Herein, the present invention will be described in more detail with reference to the following examples and comparative examples. The following examples are merely exemplary for the understanding of the present invention, and the scope of the present invention is not limited thereto.

Example 1

An organic electroluminescence display device of Example 1 having a red light emitting layer disposed on a lower portion of a green common light emitting layer was manufactured. Except that the red light emitting layer is disposed on an upper portion of the green light emitting layer, an organic electroluminescence display device of Comparative Example 1 was manufactured in the same manner as in Example 1.

The driving voltage and efficiency in a red pixel region of Example 1 and Comparative Example 1 were measured, and the results are shown in Table 1 below.

TABLE 1

|  | Driving voltage (V) | Efficiency (cd/A) |
| --- | --- | --- |
| Example 1 | 6 | 45 |
| Comparative Example 1 | 5.4 | 36.7 |

Referring to the results in Table 1, in the case in which the red light emitting layer was disposed on a lower portion of the green light emitting layer, the driving voltage was maintained at substantially the same level and the efficiency was improved compared with the case in which the red light emitting layer was disposed on an upper portion of the green light emitting layer.

Example 2

An organic electroluminescence display device of Example 2 having a blue light emitting layer disposed on an upper portion of a green common light emitting layer was manufactured. Except that the blue light emitting layer is disposed on a lower portion of the green light emitting layer, an organic electroluminescence display device of Comparative Example 2 was manufactured in the same manner as in Example 2.

The driving voltage, efficiency, color coordinates of a blue pixel region of Example 2 and Comparative Example 2 were measured, and the results are shown in Table 2 below.

TABLE 2

|  | Driving voltage (V) | Efficiency (cd/A) | CIE_x | CIE_y |
| --- | --- | --- | --- | --- |
| Example 2 | 5.2 | 127.5 | 0.141 | 0.047 |
| Comparative Example 2 | 7.1 | 35.1 | 0.195 | 0.086 |

Referring to Table 2, in the case in which the blue light emitting layer was disposed on an upper portion of the green common light emitting layer, it can be seen that the driving voltage was reduced, efficiency was greatly improved, and the occurrence of color mixture was prevented when compared with the case in which the blue light emitting layer was disposed on a lower portion of the green common light emitting layer.

The organic electroluminescence display device DD according to an embodiment of the present disclosure is advantageous in realizing high resolution having high efficiency by disposing a green common light emitting layer. Furthermore, by disposing a red light emitting layer on a lower portion of the green common light emitting layer, and disposing a blue light emitting layer on an upper portion of the green common light emitting layer, the organic electroluminescence display device DD according to an embodiment of the present disclosure is also advantageous in realizing high efficiency, long life, and low driving voltage.

Herein, a method for manufacturing an organic electroluminescence display device according to an embodiment of the present disclosure will be described. Herein, differences between the organic electroluminescence display device according to an embodiment of the present disclosure described above and the organic light emitting display device according to the present embodiment of the present disclosure will be described in further detail. Non-described parts correspond to the organic electroluminescence display device according to an embodiment of the present disclosure described above. The same reference numerals are used for the same or similar elements, and redundant description will be omitted.

FIG. 11 is a schematic flowchart of a method for manufacturing an organic electroluminescence display device according to an embodiment of the present disclosure.

Referring to FIG. 11, a method for manufacturing an organic electroluminescence display device according to an embodiment of the present disclosure includes the steps of: forming or providing a first electrode on a substrate (S100); forming or providing an organic light emitting layer on the first electrode (S200); and forming or providing a second electrode on the organic light emitting layer (S300).

FIGS. 12A to 12E are cross-sectional views for describing a method for manufacturing an organic electroluminescence display device according to an embodiment of the present disclosure.

Figure 12A:
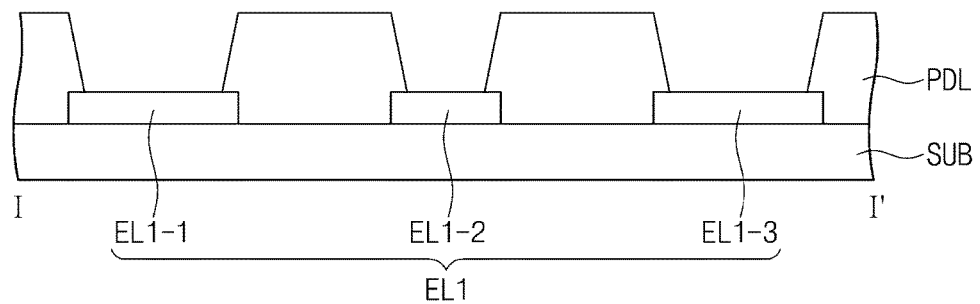
FIGS. 12A to 12E are cross-sectional views for describing a method for manufacturing an organic electroluminescence display device according to an embodiment of the present disclosure.

Referring to FIG. 12A, a first electrode EL1 is first formed on a substrate SUB, the first electrode EL1 includes a first sub-electrode EL1-1, a second sub-electrode EL1-2, and a third sub-electrode EL1-3 which are disposed spaced apart from each other. During this step, a step of forming a pixel defining layer PDL on the substrate SUB and the first electrode EL1 is also performed, and a part of an upper surface of each of the first sub-electrode EL1-1, the second sub-electrode EL1-2, and the third sub-electrode EL1-3 is exposed by the pixel defining layer PDL. In an embodiment, the upper surface of the first sub-electrode EL1-1 and the upper surface of the third sub-electrode EL1-3 exposed by the pixel defining layer PDL may be larger than the upper surface of the second sub-electrode EL1-2 exposed by the pixel defining layer PDL.

Figure 12B:
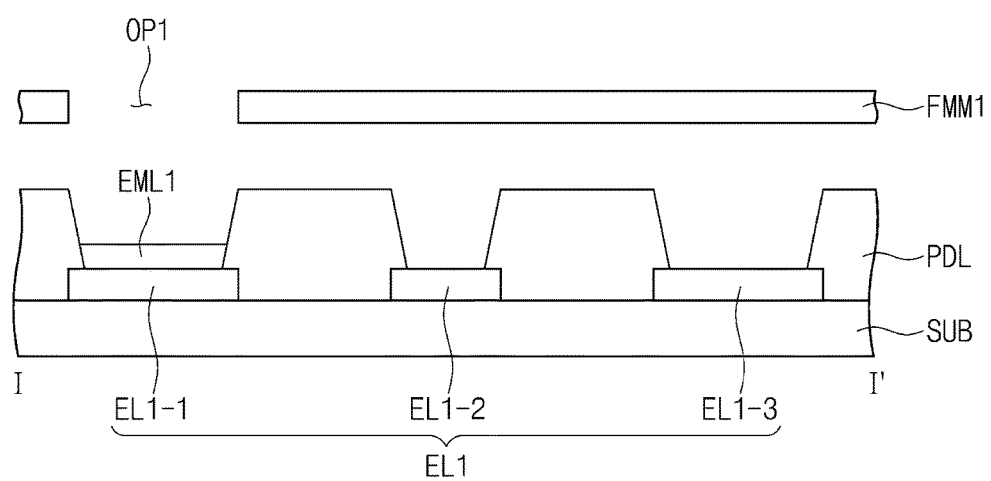

Next, a step of forming an organic light emitting layer (S200 in FIG. 11) is performed. Referring to FIG. 12B, a step of forming a first light emitting layer EML1 on the first sub-electrode EL1-1 is performed. In an embodiment, the step of forming the first light emitting layer EML1 is a step performed by using a first mask FMM1 having a first opening OP1 formed therein, and the first light emitting layer EML1 is patterned and formed only in a region corresponding to the first opening OP1. The first mask FMM1 may be, for example, a fine metal mask.

Figure 12C:
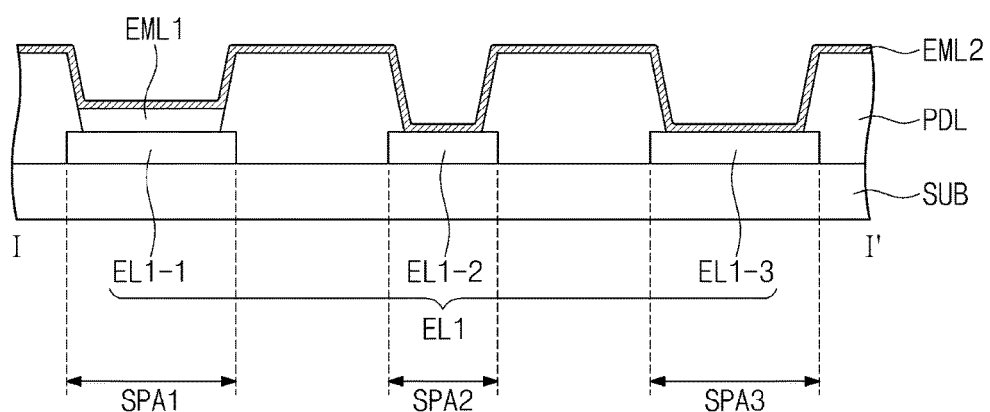

Referring to FIG. 12C, a step of forming a second light emitting layer EML2 is performed next. The second light emitting layer EML2 is disposed on the first sub-electrode EL1-1, the second sub-electrode EL1-2, and the third sub-electrode EL1-3. The second light emitting layer EML2 is disposed on the first light emitting layer EML1. In an embodiment, in the step of forming the second light emitting layer EML2, a mask is not used, unlike in the step of forming the first light emitting layer EML1.

Figure 12D:
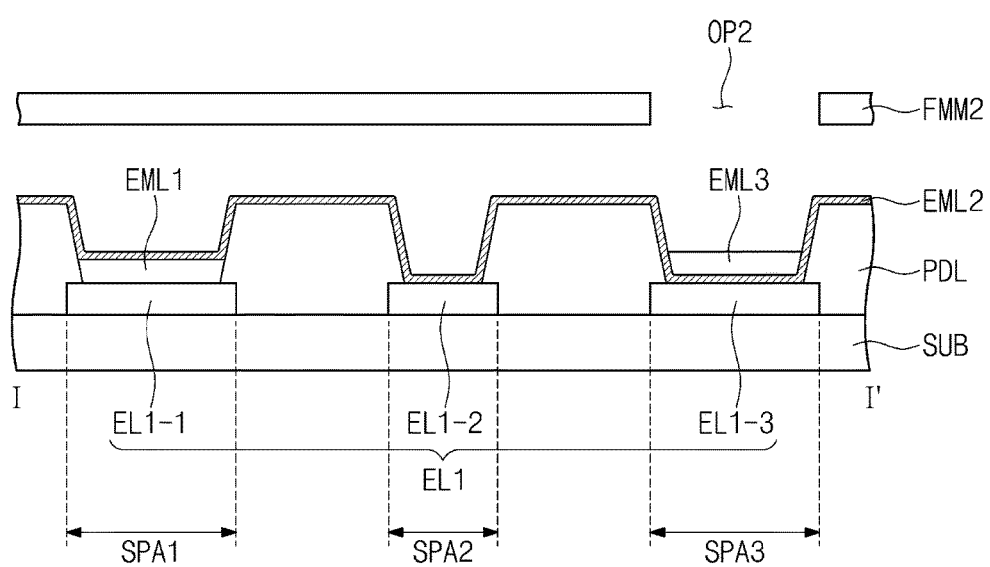

Next, referring to FIG. 12D, a step of forming a third light emitting layer EML3 is performed. The third light emitting layer EML3 is disposed on the third sub-electrode EL1-3. The third light emitting layer EML3 is disposed on the second light emitting layer EML2. In an embodiment, the step of forming the third light emitting layer EML3 is a step performed by using a second mask FMM2 having a second opening OP2 formed therein, and the third light emitting layer EML3 is patterned and formed only in a region corresponding to the second opening OP2. The second mask FMM2 may be, for example, a fine metal mask.

As described above, in an embodiment, the first light emitting layer EML1 is a red light emitting layer, the second light emitting layer EML2 is a green light emitting layer, and the third light emitting layer EML3 is a blue light emitting layer.

Figure 12E:
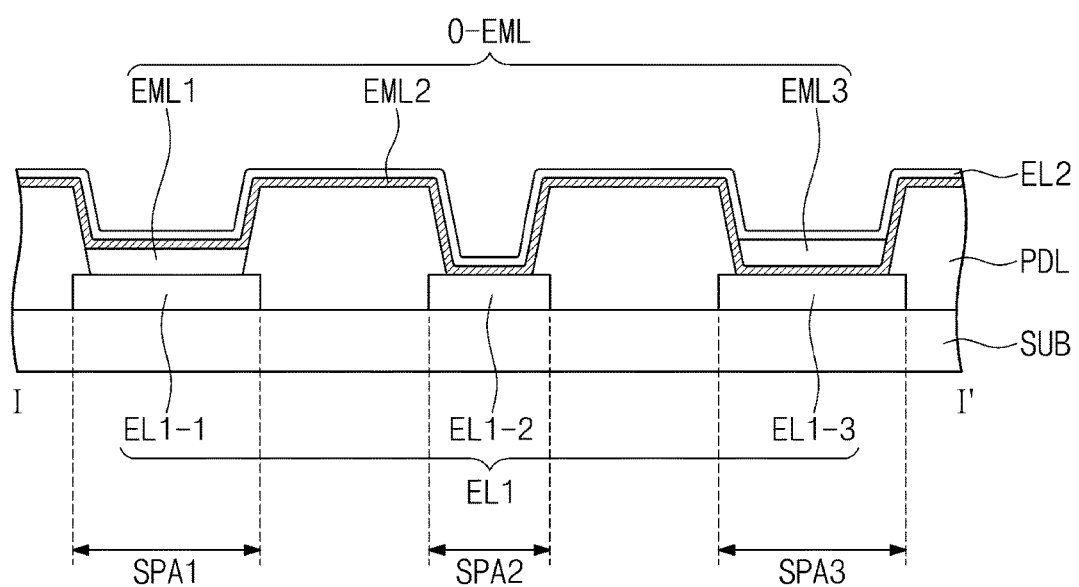

Referring to FIG. 12E, a step of forming the second electrode EL2 is performed next. In an embodiment, in the step of forming the second electrode EL2, a mask is not used, and the second electrode EL2 is formed as a common layer to be formed in whole.

The method for manufacturing an organic electroluminescence display device according to an embodiment of the present disclosure may further include an additional step if necessary or desirable. For example, the method for manufacturing an organic electroluminescence display device according to an embodiment of the present disclosure may further include a step of forming a buffer layer, a hole transport region, an electron transport region, or a fourth light emitting layer, and the like, as described above, for example.

In a step in which a mask is used, as an area is increased and resolution is increased, the degree of sagging of the mask may be increased due to the load of the mask itself, and the like, such that limitations such as the deformation of the shape of an opening may occur. Accordingly, a pixel defining layer may be formed to deviate from a desired position, or may be formed differently from the desired area and shape. Therefore, the pixel defining layer should be formed to have an area of a certain level and above. A method for manufacturing an organic electroluminescence display device according to an embodiment of the present disclosure provides the first light emitting layer EML1 and the third light emitting layer EML3 which are relatively far from each other by using a mask, and provides the second light emitting layer EML2 which is relatively close to the first light emitting layer EML1 by not using a mask, thereby reducing the possibility of occurrence of the above-mentioned limitation. As a result, the area of a pixel defining layer may be reduced, which is advantageous in realizing high resolution.

A method for manufacturing an organic electroluminescence display device according to an embodiment of the present disclosure does not require a separate mask for forming a second light emitting layer, such that process efficiency thereof in terms of cost is improved. Also, as a first light emitting layer is formed first, then a second light emitting layer is formed, and then a third light emitting layer is formed, the manufactured organic electroluminescence display device has excellent efficiency and is also advantageous in low driving voltage.

The above-disclosed subject matter is to be considered illustrative and not restrictive, and the appended claims are intended to cover all such modifications, enhancements, and other embodiments, which fall within the spirit and scope of the present disclosure. Thus, the scope of the present disclosure is to be determined by the broadest permissible interpretation of the following claims and their equivalents, and shall not be restricted or limited by the foregoing detailed description.

What is claimed is:

1. An organic electroluminescence display device comprising:
   a substrate;
   a first electrode including a first sub-electrode, a second sub-electrode, and a third sub-electrode which are arranged on the substrate and spaced apart from each other;
   an organic light emitting layer on the first electrode and including a first light emitting layer, a second light emitting layer, and a third light emitting layer; and
   a second electrode on the organic light emitting layer, wherein
   the first light emitting layer is on the first sub-electrode,
   the second light emitting layer is on the first sub-electrode, the second sub-electrode, and the third sub-electrode, the second light emitting layer overlapping each of the first sub-electrode, the second sub-electrode, and the third sub-electrode and extending continuously between the first sub-electrode, the second sub-electrode, and the third sub-electrode on a plane,
   the third light emitting layer is on the third sub-electrode,
   the first light emitting layer is on a lower portion of the second light emitting layer, and the third light emitting layer is on an upper portion of the second light emitting layer, and
   the first light emitting layer is a red light emitting layer configured to emit red light, the second light emitting layer is a green light emitting layer configured to emit green light, and the third light emitting layer is a blue light emitting layer configured to emit blue light.

2. The organic electroluminescence display device of claim 1, further comprising:
   a first pixel region configured to emit red light;
   a second pixel region configured to emit green light; and
   a third pixel region configured to emit blue light,
   wherein a shortest distance between the first pixel region and the second pixel region is shorter than a shortest distance between the first pixel region and the third pixel region on a plane.

3. The organic electroluminescence display device of claim 2, wherein
   the second light emitting layer is on the first pixel region, the second pixel region, and the third pixel region,
   the first light emitting layer is on the first pixel region, and
   the third light emitting layer is on the third pixel region.

4. The organic electroluminescence display device of claim 1, further comprising a buffer layer on at least one of an upper portion or a lower portion of the second light emitting layer.

5. The organic electroluminescence display device of claim 1, further comprising a p-dopant layer between the second light emitting layer and the third light emitting layer.

6. The organic electroluminescence display device of claim 5, further comprising a fourth buffer layer between the p-dopant layer and the third light emitting layer.

7. The organic electroluminescence display device of claim 1, wherein the second light emitting layer is configured to emit light in a region overlapping the second sub-electrode.

8. The organic electroluminescence display device of claim 7, wherein the second light emitting layer is not configured to emit light in a region overlapping the first sub-electrode and the third sub-electrode.

9. The organic electroluminescence display device of claim 1, wherein
   the first electrode further includes a fourth sub-electrode,
   the organic light emitting layer further includes a fourth light emitting layer on the fourth sub-electrode,
   a part of the second light emitting layer is on the fourth sub-electrode, and
   the fourth light emitting layer is configured to emit near-infrared light.

10. The organic electroluminescence display device of claim 9, wherein the fourth light emitting layer is on an upper portion of the second light emitting layer.

11. The organic electroluminescence display device of claim 9, wherein the fourth light emitting layer is on a lower portion of the second light emitting layer.

12. The organic electroluminescence display device of claim 1, further comprising:
- a first buffer layer on a lower portion of the second light emitting layer;
- a second buffer layer between the first light emitting layer and the first buffer layer;
- a fourth buffer layer between the second light emitting layer and the third light emitting layer;
- a p-dopant layer between the second light emitting layer and the fourth buffer layer; and
- a fifth buffer layer on the third light emitting layer.

13. The organic electroluminescence display device of claim 1, wherein the first light emitting layer contacts the first sub-electrode, and the second light emitting layer contacts the second sub-electrode.

14. The organic electroluminescence display device of claim 1, wherein
- the first light emitting layer is not overlapping with the second sub-electrode and the third sub-electrode on the plane, and
- the third light emitting layer is not overlapping with the first sub-electrode and the second sub-electrode on the plane.

15. An organic electroluminescence display device comprising:
- a substrate;
- a first electrode including a first sub-electrode, a second sub-electrode, and a third sub-electrode which are arranged on the substrate and spaced apart from each other;
- an organic light emitting layer on the first electrode and including a first light emitting layer, a second light emitting layer, and a third light emitting layer; and
- a second electrode on the organic light emitting layer, wherein
- the first light emitting layer is on the first sub-electrode,
- the second light emitting layer is on the first sub-electrode, the second sub-electrode, and the third sub-electrode,
- the third light emitting layer is on the third sub-electrode,
- the first light emitting layer is on a lower portion of the second light emitting layer, and the third light emitting layer is on an upper portion of the second light emitting layer, and
- the first light emitting layer is a red light emitting layer configured to emit red light, the second light emitting layer is a green light emitting layer configured to emit green light, and the third light emitting layer is a blue light emitting layer configured to emit blue light,
- the organic electroluminescence display device further comprising:
- a first buffer layer on a lower portion of the second light emitting layer, wherein the first light emitting layer is between the first buffer layer and the second light emitting layer.

16. The organic electroluminescence display device of claim 15, further comprising a second buffer layer between the first light emitting layer and the first buffer layer.

17. The organic electroluminescence display device of claim 15, wherein the first buffer layer is on the first sub-electrode, the second sub-electrode, and the third sub-electrode.

18. The organic electroluminescence display device of claim 15, further comprising a third buffer layer between the first light emitting layer and the second light emitting layer.

19. A method for manufacturing an organic electroluminescence display device, the method comprising:
- forming a first electrode including a first sub-electrode, a second sub-electrode, and a third sub-electrode on a substrate and being spaced apart from each other;
- forming, on the first electrode, an organic light emitting layer including a first light emitting layer, a second light emitting layer, and a third light emitting layer; and
- forming a second electrode on the organic light emitting layer,
- wherein the forming of the organic light emitting layer includes:
- forming the first light emitting layer on the first sub-electrode,
- forming the second light emitting layer on the first sub-electrode, the second sub-electrode, and the third sub-electrode, the second light emitting layer overlapping each of the first sub-electrode, the second sub-electrode, and the third sub-electrode and extending continuously between the first sub-electrode, the second sub-electrode, and the third sub-electrode on a plane, and
- forming the third light emitting layer on the third sub-electrode,
- wherein the first light emitting layer is on a lower portion of the second light emitting layer, and the third light emitting layer is on an upper portion of the second light emitting layer, and
- wherein the first light emitting layer is a red light emitting layer configured to emit red light, the second light emitting layer is a green light emitting layer configured to emit green light, and the third light emitting layer is a blue light emitting layer configured to emit blue light.

20. The method of claim 19, wherein
- the forming of the first light emitting layer and the forming of the third light emitting layer are performed using a mask having an opening, respectively, and
- the forming of the second light emitting layer is performed without a mask.

* * * * *